(12) United States Patent
Gee et al.

(10) Patent No.: US 9,437,814 B1
(45) Date of Patent: Sep. 6, 2016

(54) MITIGATING DAMAGE FROM A CHEMICAL MECHANICAL PLANARIZATION PROCESS

(71) Applicant: Crossbar, Inc., Santa Clara, CA (US)

(72) Inventors: Harry Yue Gee, Santa Clara, CA (US); Majid Milani, San Jose, CA (US); Natividad Vasquez, Jr., San Francisco, CA (US); Steven Patrick Maxwell, Sunnyvale, CA (US); Sundar Narayanan, Cupertino, CA (US)

(73) Assignee: Crossbar, Inc., Santa Clara, CA (US)

( * ) Notice: Subject to any disclaimer, the term of this patent is extended or adjusted under 35 U.S.C. 154(b) by 7 days.

(21) Appl. No.: 14/473,879

(22) Filed: Aug. 29, 2014

Related U.S. Application Data

(60) Provisional application No. 61/936,822, filed on Feb. 6, 2014.

(51) Int. Cl.
*H01L 21/332* (2006.01)
*H01L 45/00* (2006.01)

(52) U.S. Cl.
CPC .......... *H01L 45/06* (2013.01); *H01L 45/1233* (2013.01); *H01L 45/14* (2013.01); *H01L 45/145* (2013.01); *H01L 45/148* (2013.01); *H01L 45/16* (2013.01); *H01L 45/1608* (2013.01)

(58) Field of Classification Search
USPC .......... 438/137, 328; 257/E21.645, E21.662, 257/E27.102, E45.002, 1, 2, 213; 365/148, 365/151, 129
See application file for complete search history.

(56) References Cited

U.S. PATENT DOCUMENTS 9,012,307 B2 * 4/2015 Jo .................... H01L 45/085
257/E29.17
2012/0015506 A1 * 1/2012 Jo .................... H01L 45/085
438/482

* cited by examiner

*Primary Examiner* — Telly Green
(74) *Attorney, Agent, or Firm* — Amin, Turocy & Watson, LLP

(57) ABSTRACT

During fabrication of a two-terminal memory device, a terminal (e.g., bottom terminal) can be formed. After formation of the terminal, a chemical mechanical planarization (CMP) process can be applied that, depending on the composition of the terminal, can cause damage that affect operating characteristics of the finished memory device or cell. In some embodiments, such damage can be removed by one or more post-CMP processes. In some embodiments, such damage can be mitigated so as to prevent the damage from occurring at all, by, e.g., forming a sacrificial layer atop the terminal prior to performing the CMP process. Thus, the sacrificial layer can operate to protect the terminal from damage resulting from the CMP process, with the remainder of the sacrificial layer being removed prior to completing the fabrication of the two-terminal memory device.

24 Claims, 15 Drawing Sheets

MITIGATING DAMAGE FROM A CHEMICAL MECHANICAL PLANARIZATION PROCESS

CROSS-REFERENCE TO RELATED APPLICATIONS

This application claims the benefit of U.S. Provisional Patent Application Ser. No. 61/936,822 filed on Feb. 6, 2014 entitled, "MITIGATING DAMAGE FROM A CHEMICAL MECHANICAL PLANARIZATION PROCESS." The entirety of this application is incorporated herein by reference, for all purposes.

TECHNICAL FIELD

This disclosure generally relates to semiconductor fabrication, and more particularly to mitigating damage or potential damage to a terminal of a two-terminal memory device due to a chemical mechanical planarization (CMP) process.

BACKGROUND

Resistive-switching memory represents a recent innovation within the field of integrated circuit technology. While much of resistive-switching memory technology is in the development stage, various technological concepts for resistive-switching memory have been demonstrated by the inventors and are in one or more stages of verification to prove or disprove associated theories or techniques. The inventors believe that resistive-switching memory technology shows compelling evidence to hold substantial advantages over competing technologies in the semiconductor electronics industry.

The inventors believe that resistive-switching memory cells can be configured to have multiple states with distinct resistance values. For instance, for a single bit cell, the restive-switching memory cell can be configured to exist in a relatively low resistance state or, alternatively, in a relatively high resistance state. Multi-bit cells might have additional states with respective resistances that are distinct from one another and distinct from the relatively low resistance state and the relatively high resistance state. The distinct resistance states of the resistive-switching memory cell represent distinct logical information states, facilitating digital memory operations. Accordingly, the inventors believe that arrays of many such memory cells, can provide many bits of digital memory storage.

The inventors have been successful in inducing resistive-switching memory to enter one or another resistive state in response to an external condition. Thus, in transistor parlance, applying or removing the external condition can serve to program or de-program (e.g., erase) the memory. Moreover, depending on physical makeup and electrical arrangement, a resistive-switching memory cell can generally maintain a programmed or de-programmed state. Maintaining a state might require other conditions be met (e.g., existence of a minimum operating voltage, existence of a minimum operating temperature, and so forth), or no conditions be met, depending on the characteristics of a memory cell device.

The inventors have put forth several proposals for practical utilization of resistive-switching technology to include transistor-based memory applications. For instance, resistive-switching elements are often theorized as viable alternatives, at least in part, to metal-oxide semiconductor (MOS) type memory transistors employed for electronic storage of digital information. Models of resistive-switching memory devices provide some potential technical advantages over non-volatile FLASH MOS type transistors.

In light of the above, the inventors desire to continue developing practical utilization of resistive-switching technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Systems and methods disclosed herein relate to mitigating damage to a terminal of a two-terminal memory device potentially resulting from a chemical mechanical planarization (CMP) process. For example, in some embodiments, the terminal of the two-terminal memory device can be formed. The terminal can be formed patterned on or otherwise in contact with a metal interconnect layer that is situated in a dielectric layer. An intermetal dielectric layer can be formed atop the dielectric layer and the terminal. A CMP process to planarize the terminal with respect to the intermetal dielectric layer can be performed. A post-C MP process for removing the damaged portion of the terminal resulting from the CMP process can be performed.

In some embodiments, the terminal of the two-terminal memory device can be formed. The terminal can be formed patterned on or otherwise in contact with a metal interconnect layer that is situated in a dielectric layer. A sacrificial layer can be formed atop the terminal. An intermetal dielectric layer can be formed atop the dielectric layer, the sacrificial layer, and/or the terminal. A CMP process to planarize the sacrificial layer with respect to the intermetal dielectric layer can be performed. A post-CMP removal process for removing the sacrificial layer from the terminal can be performed.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects and advantages of the present invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Introduction

Figure 1:
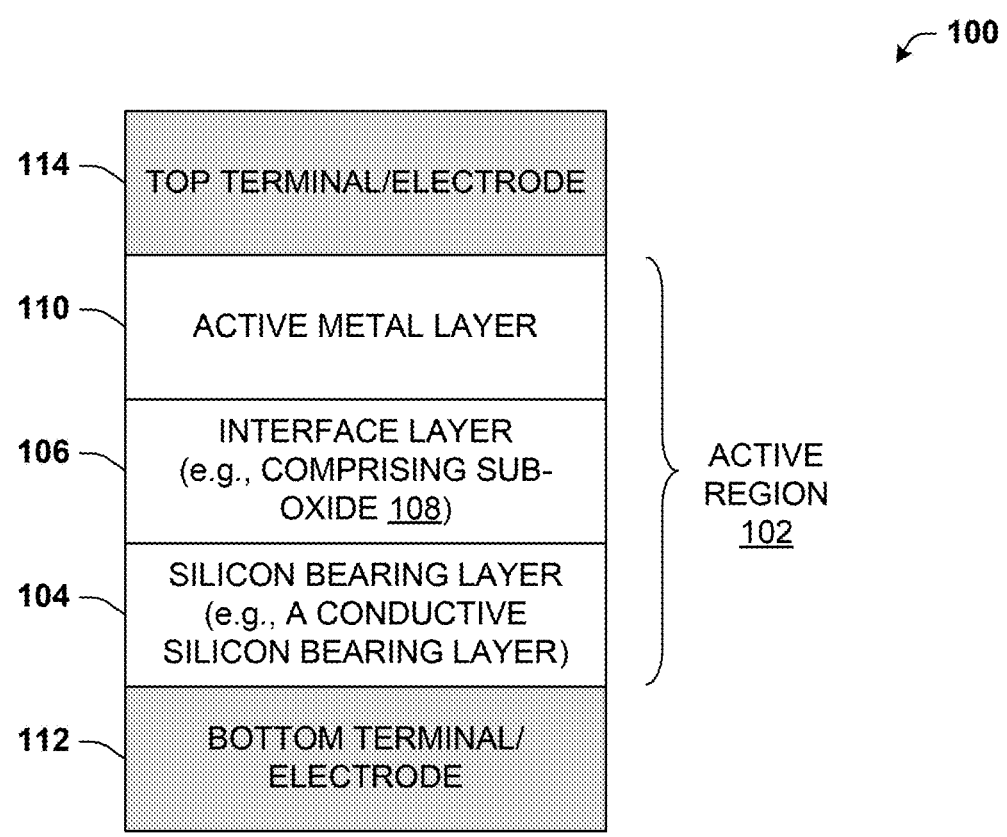
FIG. 1 illustrates a block diagram of an example two-terminal memory cell or device in accordance with certain embodiments of this disclosure.

In the domain of semiconductor manufacturing, chemical mechanical planarization (CMP) is known. CMP represents a process of smoothing surfaces with a combination of chemical and mechanical elements. Typically, a CMP process uses an abrasive and/or corrosive chemical slurry in combination with a polishing pad that polishes semiconductor wafers, thereby affecting the semiconductor element that is exposed in the wafer.

In certain two-terminal memory cells, particularly resistive-switching memory cells, CMP processes can cause damage that affects the operating characteristics of the memory cell. For example, during fabrication of a two-terminal memory cell a bottom terminal can be formed first on a wafer. After formation of the bottom terminal, a CMP process is typically run to planarize the top surface of the wafer before the remainder of the of the two-terminal memory cell is formed. Two-terminal memory cells with metal terminals might receive abrasions from the CMP process, but as the metal will likely still retain its expected conductivity, and therefore not be significantly affected by the CMP process in terms of operating characteristics.

On the other hand, the inventors have proposed innovative two-terminal memory cells that have advantageous properties, and in some cases these two-terminal memory cells include terminals that are comprised of silicon (Si), silicon germanium (SiGe), or the like for which the resistivity and/or conductivity depends on both the doping concentration and the crystalline natural (e.g., "crystallinity") of the element. A CMP process that grinds away some of the top layers of a terminal can change the crystallinity of that terminal, which can lead to increased cell-to-cell leakage current variations. In contrast, a uniform, flat, damage-free surface of bottom electrodes (in the wafer) can reduce the leakage current variation and provide other advantages. Accordingly, it can be advantageous to mitigate damage to terminals or other elements of a two-terminal memory cell that result from a CMP process. By doing so, operating characteristics can be optimized or better predicted and fabrication of the two-terminal memory cell can be in accord with conventional fabrication means.

Example Two-Terminal Memory Devices/Cells

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of disclosure may be practiced without these specific details, or with other methods, components, materials, etc. In other instances, well-known structures and devices are shown in block diagram form to facilitate describing the subject disclosure.

Referring initially to FIG. 1, an example two-terminal memory device 100 is depicted. Device 100 can be a resistive-switching memory device such as a resistive random access memory (RRAM) device, for which certain illustrative characteristics or aspects are provided with reference to FIG. 2. Device 100 may be a monolithic stack of layers and may be formed on top of an insulating substrate upon which one or more CMOS devices have been formed. In some embodiments, the CMOS devices include control transistors/control logic, or other devices (e.g. processor, logic) that may be selectively coupled to terminals of the two-terminal memory device.

The monolithic stack of layers of two-terminal memory cell 100 can include an active region 102 that can be situated between a bottom terminal 112 (e.g., one layer of the monolithic stack) and top terminal 114 (e.g., another layer of the monolithic stack) that are further detailed with reference to FIGS. 3A and 3B. Active region 102 can be created comprising a contact layer (e.g. a silicon bearing layer) 104, interface layer 106, and active metal layer 110. Interface layer 106 can be composed of or comprise one or more engineered or controlled oxide(s), which is referred to herein as sub-oxide 108. Interface layer 106 can comprise a non-stoichiometric sub-oxide (e.g., sub-oxide 108) that can be a combination or mixture, possibly non-homogenous, of various silicon-based layers or elements with an aggregate chemical formula of $SiO_x$, where $0<X<2$. As another example, the aggregate chemical formula can be $Si_xGe_yO_z$, where $x≥0$, $y≥0$, $z≥0$, $x+y≤z≤2 (x+y)$. In various embodiments, interface layer 106 includes multiple crystalline defects. Other examples can exist.

Figure 2:
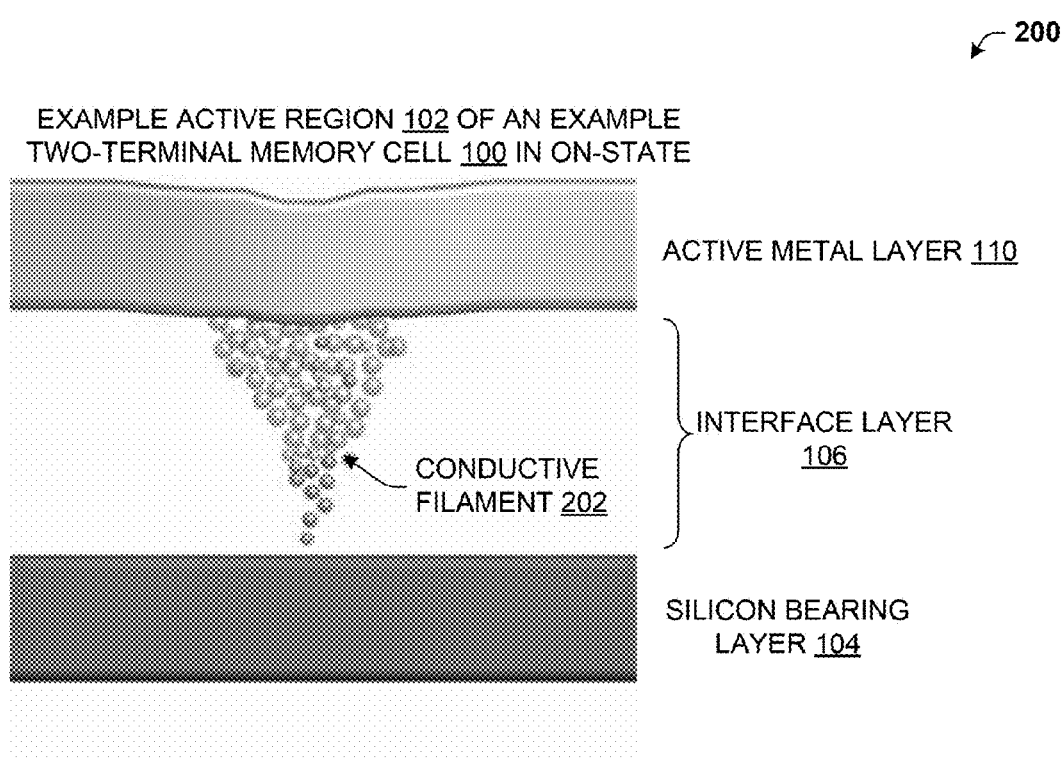
FIG. 2 depicts an example illustration of a cross-section of an example active region of an example two-terminal memory cell in accordance with certain embodiments of this disclosure.

While still referring to FIG. 1, but turning also now to FIG. 2, illustration 200 is provided. Illustration 200 depicts a cross-section of an example active region 102 of an example two-terminal memory cell 100. In order to provide additional detail or context, it is understood that this disclosure relates to two-terminal memory cells, particularly resistive switching two-terminal memory cells, in various embodiments. Resistive switching two-terminal memory cells (also referred to as resistive switching memory cells or devices), as utilized herein, comprise circuit components having two electrical contacts (also referred to herein as electrodes or terminals) with an active region (e.g., active region 102) between the two conductive contacts (e.g., terminals 112, 114).

An example of the active region 102 of the two-terminal memory device 100 is provided by illustration 200. This active region 102 can exhibit a plurality of stable or semi-stable resistive states, each resistive state having different electrical characteristics (e.g., resistance). Moreover, respective states of the plurality of states can be formed or activated in response to a respective voltage difference applied at the two conductive contacts. One example of a resistive switching two-terminal memory device, though not exhaustive, can include a resistive random access memory (RRAM) cell or device.

Embodiments of the subject disclosure can provide a filamentary-based memory cell. For example, in a 'programmed' or 'on' state, in response to a program voltage applied across the terminals 112, 114, ions are injected from active metal layer 110 and permeate interface layer 106 which is further detailed infra. Once the program voltage is removed, the ions are trapped within the defects of interface layer 106 and become neutral metal particles. In some embodiments, the trapped metal particles form one or more conductive filament 202. One example of a filamentary-based memory cell can comprise: a p-type (positive) silicon bearing layer 104; the interface layer 106 (also referred to as a resistive switching layer or a resistive switching material layer), which in this case can comprise sub-oxide 108, and active metal layer 110 for providing filament forming particles into the interface layer 106. The contact layer 104, e.g., p-type (or possibly n-type) silicon bearing layer 104 can include a p-type polysilicon, p-type SiGe, or the like. In other embodiments, contact layer 104 may be TiN, TaN, or other metal. The interface layer 106 can comprise, e.g., an undoped amorphous silicon layer or mixture, a doped polysilicon layer or mixture, a doped silicon germanium layer or mixture, a semiconductor layer or mixture having intrinsic characteristics, a silicon sub-oxide layer or mixture, and so forth.

Examples of the active metal layer 110 can include, among others: silver (Ag), gold (Au), titanium (Ti), nickel (Ni), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing can be employed for the active metal layer 110 in some aspects. In some embodiments, an active metal layer 110 may two layers, such as a layer of silver, aluminum, or the like above a thin layer of oxidizable metal, e.g. titanium. Some details pertaining to embodiments of the subject disclosure similar to the foregoing example can be found in the following U.S. patent applications that are licensed to the assignee of the present application for patent: application Ser. No. 11/875,541 filed Oct. 19, 2007 and application Ser. No. 12/575,921 filed Oct. 8, 2009, each of which are incorporated by reference herein in their respective entireties and for all purposes.

Generally, to program one or more memory cell, a suitable program voltage can be applied across the memory cell causing a conductive filament to form through a resistive portion (e.g., interface layer) of the memory cell as mentioned above. This can further cause the memory cell to switch from a relatively high resistive state, to a relatively low resistive state. An erase process can be implemented to reverse the foregoing, at least in part, causing the memory cell to return to the high resistive state from the low resistive state. This physical change of state, in the context of memory, can be associated with respective logical states of a binary bit. Accordingly, multiple such memory cells can be programmed or erased to represent respective zeroes or ones of binary information and, by retaining those states over time, in effect persist binary information. For various reasons, in some embodiments, resistive switching memory cells are generally quick to program and responsive, changing state readily in response to a program voltage or an erase voltage. This quick switching of state is a significant advantage of various disclosed memory cells over other memory cell technologies.

As applied to illustration 200, when a suitable program voltage (e.g., a positive voltage) is applied across the terminals of two-terminal memory cell 100, ions from active metal layer 110 move into the adjacent interface layer 106, which is at least partially permeable to the ions that collectively form conductive filament 202. Conductive filament 202 can span the entire thickness or a portion of the interface layer 106, facilitating increased electrical conductivity through the interface layer 106, which otherwise has a high electrical resistance.

When the program voltage is applied and conductive filament 202 forms, the memory cell is said to be in the on-state, which is a low-resistance state. In response to a suitable erase voltage (e.g., a negative voltage), conductive filament 202 can at least in part deform or retract, breaking the electrical conductive path. Such is a high-resistance state, associated with an off-state. The state can be determined by measuring current through cell 100 when a suitable read voltage is applied. The read voltage generally is not sufficient (or the proper polarity) to either form or disperse conductive filament 202, so current readings associated with the read current can be used to determine if the cell is in the high-resistance state (e.g., off) or the low-resistance state (e.g., on). In this example, two-terminal memory cell 100 is in the on state, with conductive filament spanning a significant portion of interface layer 106.

Figure 3A:
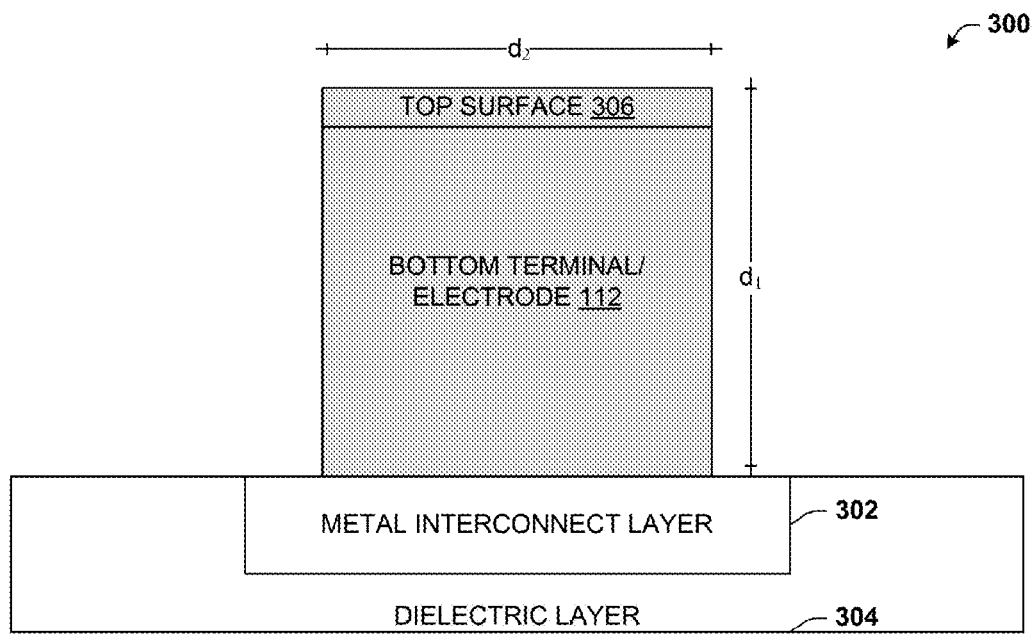
FIG. 3A illustrates an example arrangement in which the terminal is formed on the metal interconnect layer that is situated in the dielectric layer in accordance with certain embodiments of this disclosure.
Figure 3B:
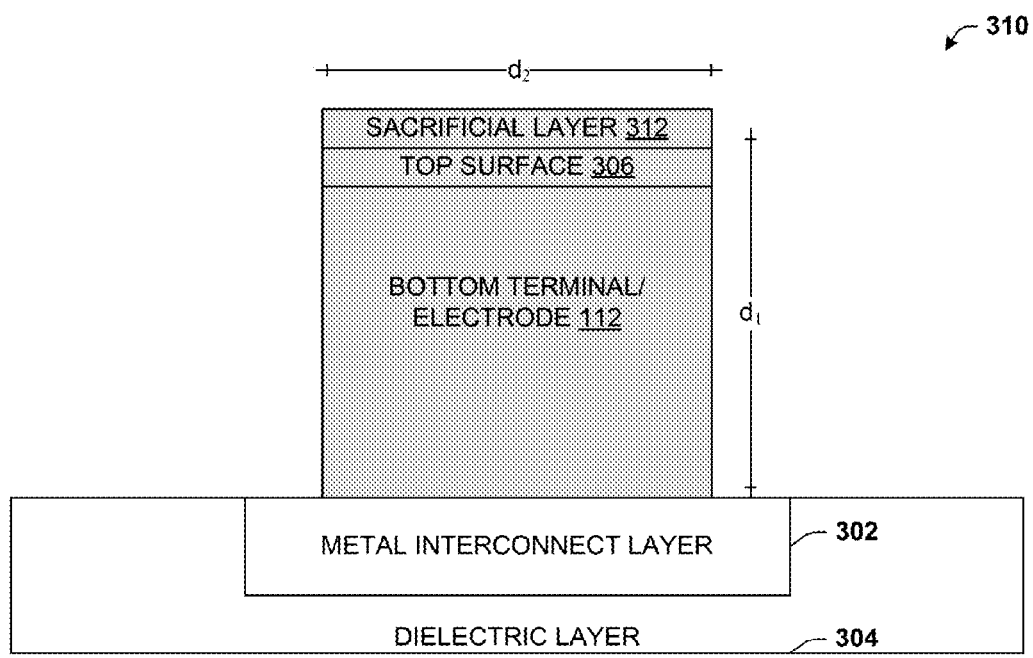
FIG. 3B illustrates an example arrangement in which the sacrificial layer is formed atop the terminal in accordance with certain embodiments of this disclosure.

FIGS. 3A and 3B are intended to be examined in conjunction with other figures detailed herein, particularly FIGS. 4A-5B, which exemplify a portion of fabrication of a two-terminal memory cell such as two-terminal memory cell 100 of FIG. 1. More specifically, FIGS. 3A, 4A, and 5A relate to fabrication of a portion of two-terminal memory cell 100 according to a first method described with reference to FIG. 6; and FIGS. 3B, 4B, and 5B relate to fabrication of a like portion of two-terminal memory cell 100 according to a second method described with reference to FIG. 8.

FIG. 3A provides an example arrangement 300 of a bottom terminal 112 of a two-terminal memory cell and/or device. Terminal 112 can be formed atop and in contact with metal interconnect layer 302, for instance, terminal 112 can be patterned on metal interconnect layer 302. Metal interconnect layer 302 can be situated in dielectric layer 304, as illustrated. Terminal 112 can comprise a material such as: p-type silicon (Si), doped p-type silicon germanium (SiGe) with a germanium (Ge) proportion of the terminal in a range of between about ten percent to about sixty percent. Additionally or alternatively, in some embodiments, terminal 112 can be comprised of a metal comprising at least one of tungsten (W), copper (Cu), aluminum (Al), titanium nitride (TiN), tantalum nitride (TaN), nickel (Ni), molybdenum (Mo), or the like.

As illustrated, terminal 112 can be formed according to specified dimensions, including a specified height (denoted herein as $d_1$) and a specified width (denoted herein as $d_2$). In some embodiments, $d_1$ can be in a range of between about 50 nanometers (nm) to about 300 nm. In some embodiments, $d_2$ can be in a range of between about 10 nm and about 200 nm. As depicted, terminal 112 may be characterized by a region (e.g. top surface 306) that can be a reference to a specific portion of terminal 112. In some embodiments, top surface 306 can have a height variation of less than about 10 nm. In one example, no point on top surface 306 varies from any other point on top surface by more than about 10 nm, in other embodiments, the height variation may be larger. In some embodiments, top surface 306 of terminal 112 might obtain this characteristic following a CMP process.

FIG. 3B provides an example arrangement 310 of a bottom terminal 112 of a two-terminal memory cell and/or device. As with arrangement 300 of FIG. 3A, terminal 112 can be formed atop and in contact with metal interconnect layer 302, and can be situated in dielectric layer 304. Terminal 112 in arrangement 310 can include similar or identical features as in arrangement 300. In addition, terminal 112 can include sacrificial layer 312 that can be formed atop terminal 112. In some embodiments, sacrificial layer 312 comprises at least one of: tungsten (W), titanium nitride (TiN), or another nitride.

Figure 4A:
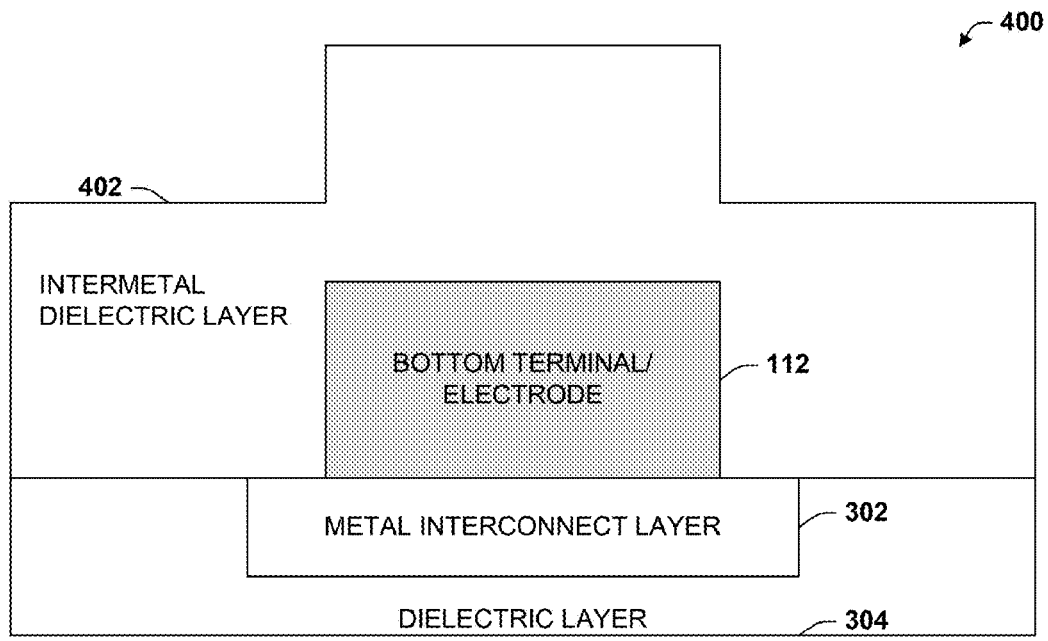
FIG. 4A depicts an example arrangement in which the intermetal dielectric layer is formed over the terminal and/or the dielectric layer in accordance with certain embodiments of this disclosure.
Figure 4B:
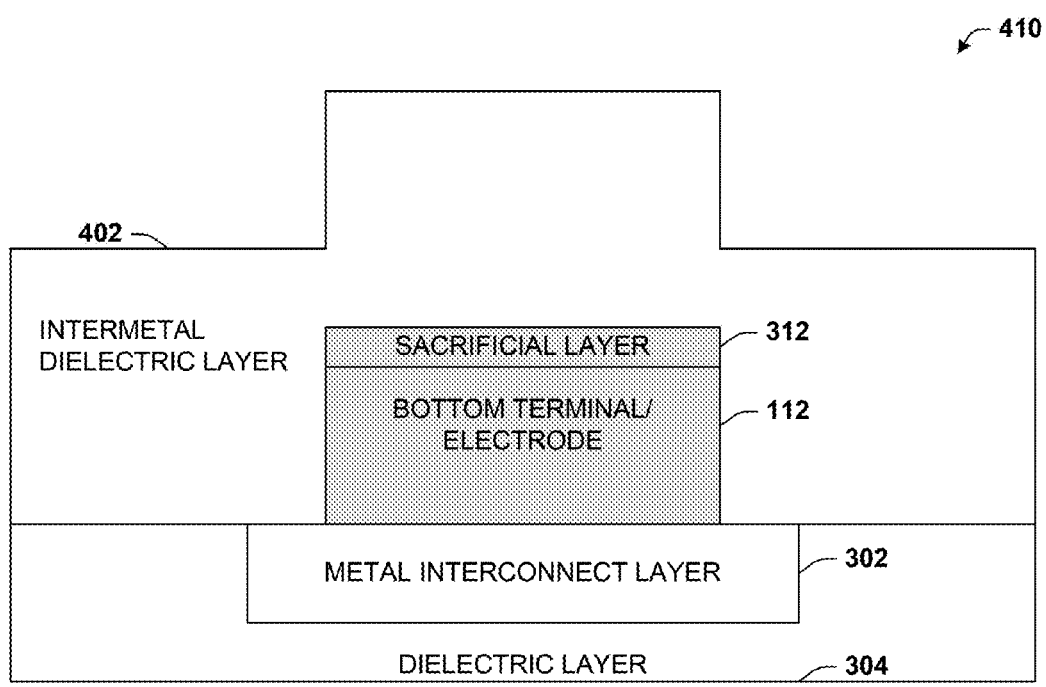
FIG. 4B depicts an example arrangement in which the intermetal dielectric layer is formed over the sacrificial layer, terminal and/or dielectric layer in accordance with certain embodiments of this disclosure.

Turning now to FIGS. 4A and 4B, arrangements 400 and 410 are depicted. Arrangement 400 relates to an intermetal dielectric layer 402 being formed over arrangement 300 of FIG. 3A. Arrangement 410 relates to the intermetal dielectric layer 402 being formed over arrangement 310 of FIG. 3B. In either arrangement 400, 410, intermetal dielectric layer 402 can be comprised of at least one of: silicon dioxide (SiO$_2$), fluorine doped silicate glass (FSG), a low-K dielectric, a nitride, or other conventional material.

Figure 5A:
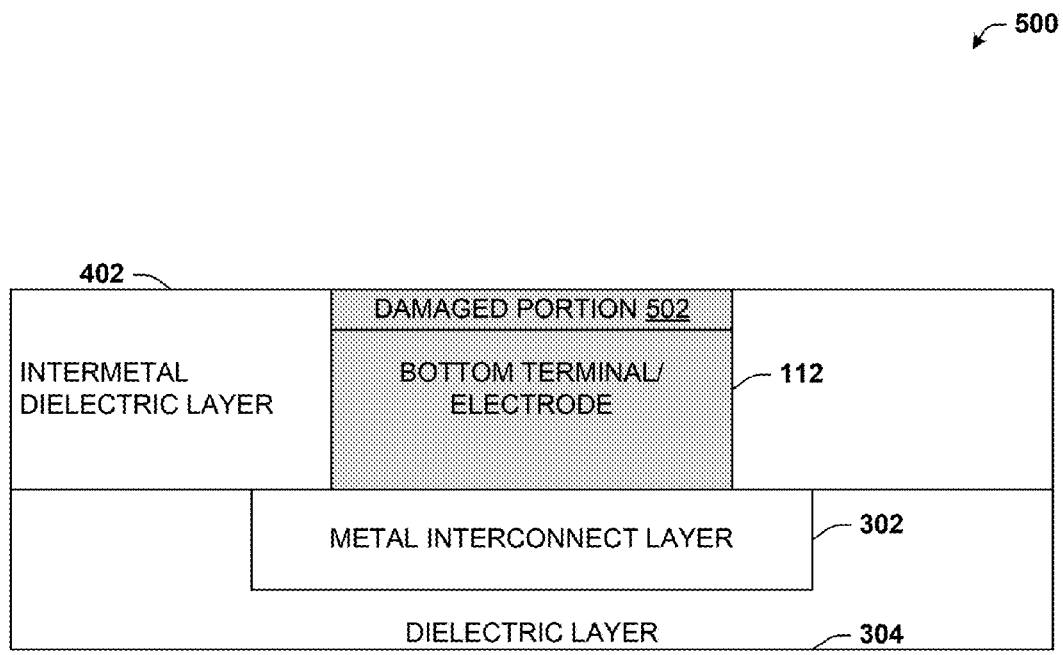
FIG. 5A illustrates an example arrangement with a damaged portion of the terminal as a result of the CMP process in accordance with certain embodiments of this disclosure.
Figure 5B:
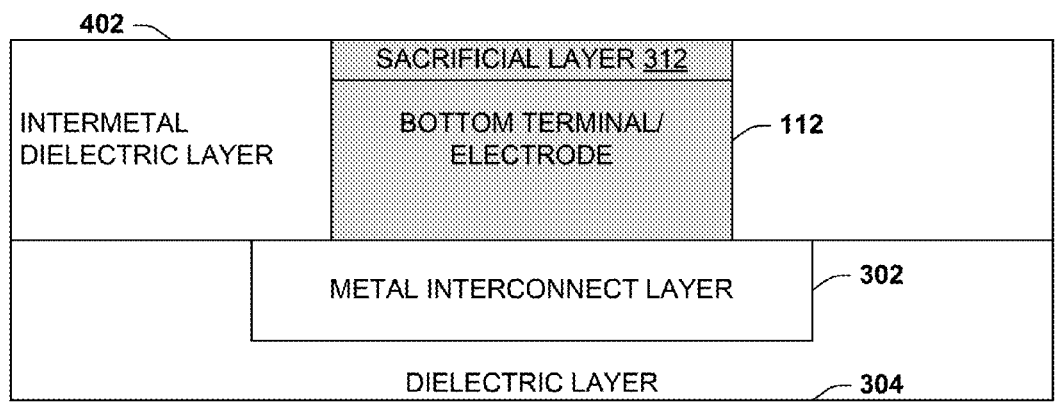
FIG. 5B depicts an example arrangement with a sacrificial layer that has undergone a CMP process in accordance with certain embodiments of this disclosure.

With reference now to FIGS. 5A and 5B, arrangements 500 and 510 are depicted. Arrangement 500 relates to arrangement 400 that has undergone a CMP process. After the CMP process, intermetal dielectric layer 402 and terminal 112 are planarized. For example, intermetal dielectric layer 402 and terminal 112 are even on a plane and/or "flush." However, as noted previously, the CMP process can cause damage to terminal 112. This damage is illustrated by damaged portion 502, which can affect operating characteristics of terminal 112 and, by extension, the particular memory cell (e.g., two-terminal memory cell 100) that includes terminal 112 with damaged portion 502.

Referring to arrangement 510, this example depicts arrangement 410 that has undergone a CMP process. After the CMP process, intermetal dielectric layer 402 and sacrificial layer 312 are planarized. For example, intermetal dielectric layer 402 and sacrificial layer 312 are aligned on a plane. However, in this case, terminal 112 is spared damage resulting from the CMP process due to the existence of sacrificial layer 312. It is understood that the CMP process can remove some portion of the sacrificial layer 312, but as long as another portion remains, terminal 112 can be protected from damage. With the foregoing in mind, example methods for mitigating damage to a terminal of a two-terminal memory device can now be discussed.

Example Methods for Mitigating Damage from a CMP Process

The diagrams included herein are described with respect to interaction between several components, or memory architectures. It should be appreciated that such diagrams can include those components and architectures specified therein, some of the specified components/architectures, and/or additional components/architectures. Sub-components can also be implemented as electrically connected to other sub-components rather than included within a parent architecture. Additionally, it is noted that one or more disclosed processes can be combined into a single process providing aggregate functionality. For instance, a program process can comprise an erase process, or vice versa, to facilitate programming and erasing a semiconductor cell by way of a single process. In addition, it should be appreciated that respective rows of multiple cell memory architectures can be erased in groups (e.g., multiple rows erased concurrently) or individually. Moreover, it should be appreciated that multiple memory cells on a particular row can be programmed in groups (e.g., multiple memory cells programmed concurrently) or individually. Components of the disclosed architectures can also interact with one or more other components not specifically described herein but known by those of skill in the art.

In view of the exemplary diagrams described supra, process methods that can be implemented in accordance with the disclosed subject matter will be better appreciated with reference to the flow chart of FIGS. 6-9. While for purposes of simplicity of explanation, the method of FIGS. 6-9 are shown and described as a series of blocks, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 6:
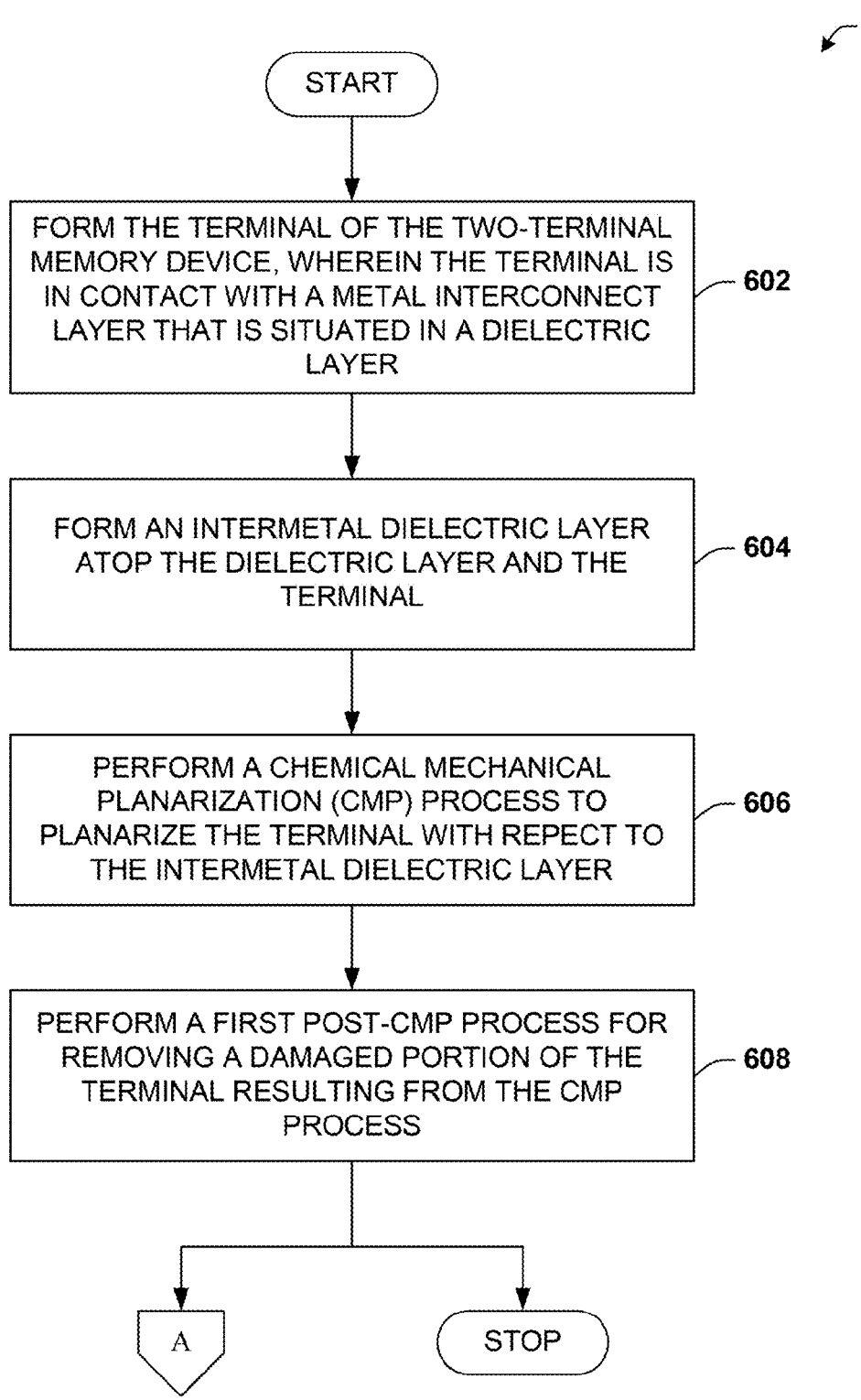
FIG. 6 illustrates an example methodology that can provide for removing damage resulting from a CMP process from a terminal of a two-terminal memory device in accordance with certain embodiments of this disclosure.

FIG. 6 illustrates exemplary method 600. Method 600 can provide for removing damage resulting from a CMP process from a terminal of a two-terminal memory device. For example, at reference numeral 602, the terminal of a two-terminal memory device can be formed. The terminal can be formed adjacent to and in contact with and/or patterned atop a metal interconnect layer that is situated in a dielectric layer. An example illustration of the terminal having been patterned or otherwise formed is provided with reference to FIG. 3A. At reference numeral 604, an intermetal dielectric layer can be formed atop the dielectric layer and the terminal. Thus, the intermetal dielectric can cover or envelope the terminal. An example illustration of the intermetal dielectric having been deposited or otherwise formed is provided with reference to FIG. 4A.

At reference numeral 606, a chemical mechanical planarization (CMP) process can be performed. The CMP process can operate to planarize the terminal with respect to the intermetal dielectric layer. For instance, the CMP can include an abrasive slurry chemical in combination with a mechanical polishing that removes an exposed surface of intermetal dielectric layer and to some extend operates on a top surface of the terminal until the intermetal dielectric layer and the terminal are planarized. An example illustration of the terminal having been planarized with respect to the intermetal dielectric layer is provided with reference to FIG. 5A. As illustrated, as a result of the CMP process the terminal can receive damage (e.g., that affects the crystalline nature of a silicon-based composition), as indicated by damaged portion 502.

Figure 10:
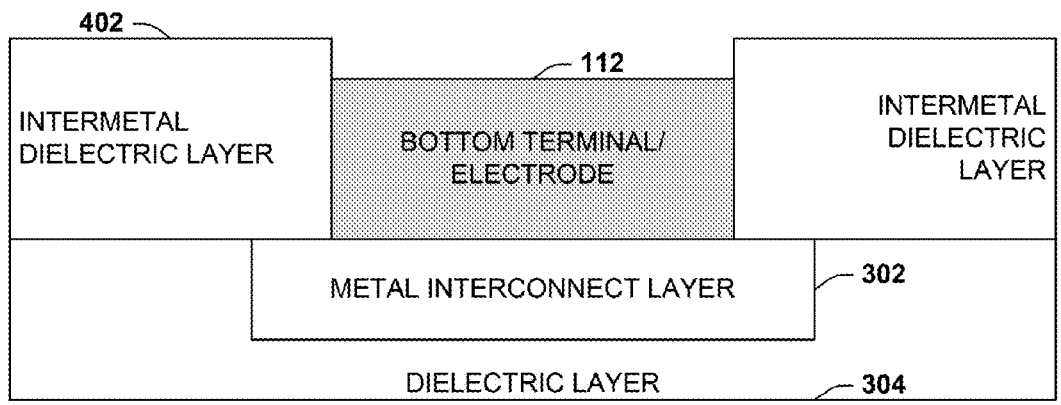
FIG. 10 depicts an example illustration of the memory device after the damaged portion or the sacrificial layer is removed is provided with reference to FIG. 10 in accordance with certain embodiments of this disclosure.

At reference numeral 608, a first post-CMP process can be performed. The first post-CMP process can operate to remove a damaged portion (e.g., damaged portion 502) of the terminal resulting from the CMP process. An example illustration of the memory device after this damaged portion is removed is provided with reference to FIG. 10.

Figure 7:
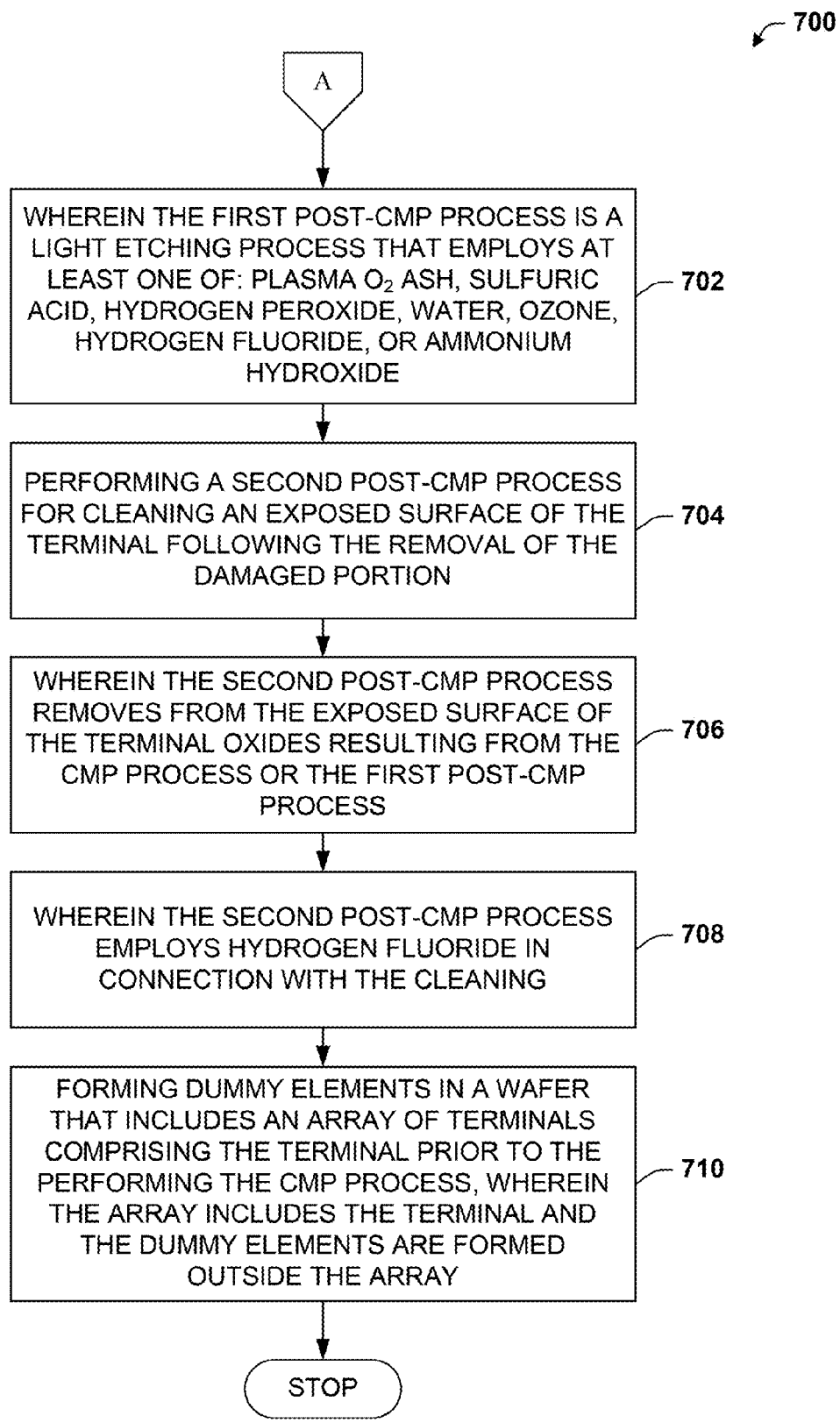
FIG. 7 illustrates an example methodology that can provide for additional features or aspects in connection with removing damage, resulting from a CMP process, from a terminal of a two-terminal memory device in accordance with certain embodiments of this disclosure.

FIG. 7 illustrates exemplary method 700. Method 700 can provide for additional features or aspects in connection with removing damage resulting from a CMP process from a terminal of a two-terminal memory device. For example, at reference numeral 702, the first post-CMP process (detailed in connection with reference numeral 608 of FIG. 6) can be a light etching process that employs at least one of: plasma oxygen ($O_2$) ash, sulfuric acid ($H_2SO_4$), hydrogen peroxide ($H_2O_2$), water ($H_2O$), ozone ($O_3$), hydrogen fluoride (HF), or ammonium hydroxide ($NH_4OH$). Regardless of the implementation, this light etching process can remove the damaged portion of the terminal without significant further damage. Thus, the remaining exposed surface of the terminal can be free of damage.

At reference numeral 704, a second post-CMP process can be performed. This second post-CMP process can be a cleaning process for cleaning an exposed surface of the terminal following the removal of the damaged portion. In some embodiments, the second post-CMP process can remove and/or clean oxides from the exposed surface of the terminal, which is described at reference numeral 706. These oxides can be resultant from the CMP process or from the first post-CMP process. In some embodiments, the second post-CMP process can employ hydrogen fluoride in connection with the cleaning process, as detailed by reference numeral 708.

At reference numeral 710, dummy features can be formed in a wafer that includes an array of terminals comprising the terminal. It is understood that the discussion herein applying to a single terminal can be extended to an array of terminals. During fabrication procedures, this array can exist on a wafer, and the CMP process can be applied to the entire wafer. It has been observed that the CMP process can be more uniform or otherwise improved when the density of terminals existing on the wafer is increased. Accordingly, in some embodiments, dummy elements can be formed on the wafer prior to the CMP process. These dummy elements can resemble terminals from the perspective of the CMP process and can operate to increase the terminal density, resulting in an improved CMP process. An example illustration of forming dummy elements is provided with reference to FIG. 11.

Figure 11:
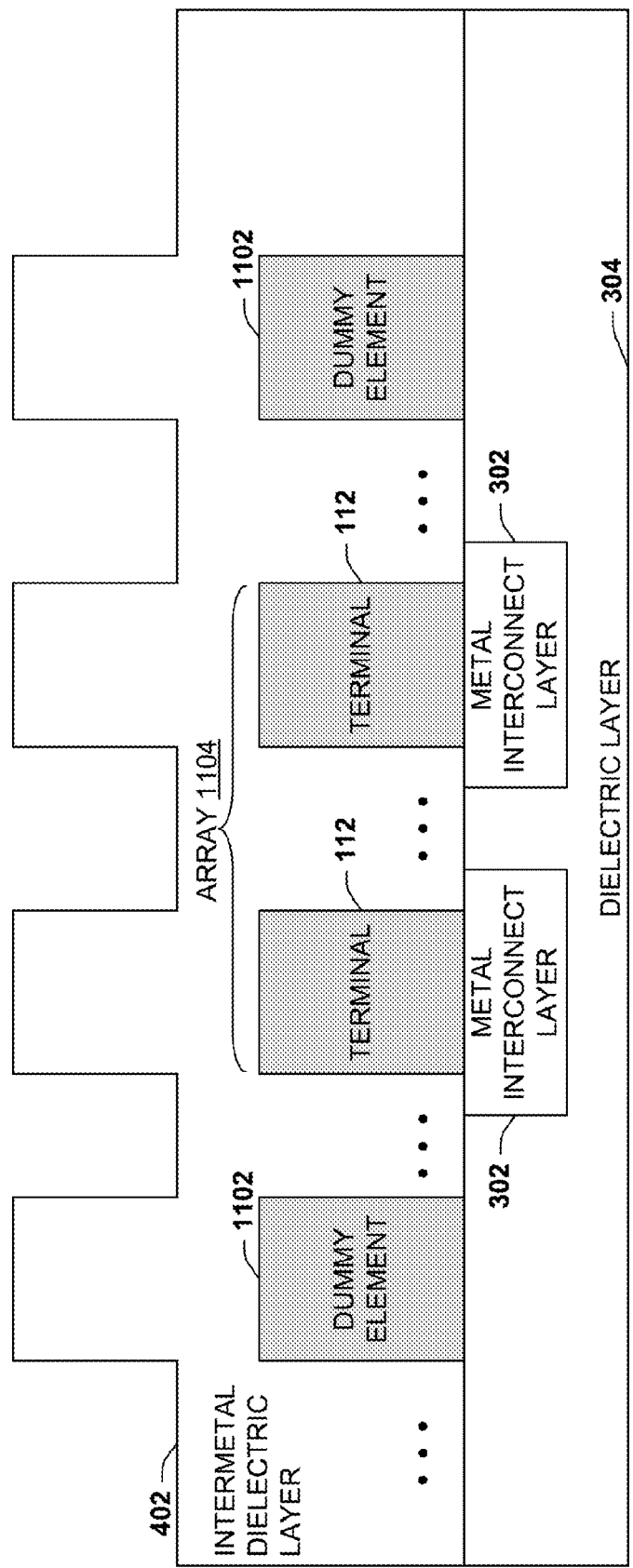
FIG. 11 depicts an example illustration of forming dummy elements on a wafer outside of an array of terminals that includes the terminal in accordance with certain embodiments of this disclosure.

While still referring to FIG. 7, but turning as well to FIG. 11, dummy elements 1102 can be formed on the dielectric layer 304. These dummy elements can be outside array 1104 that comprises a set of terminals 112, yet still on the same wafer. The intermetal dielectric layer 402 can be deposited or otherwise formed over the terminals 112 and the dummy elements 1102. When the CMP-process is applied to planarize layer 402, such can operate on both the terminals 112 of array 1104 and dummy elements 1102. Thus, CMP-process be more uniform or the like.

Figure 8:
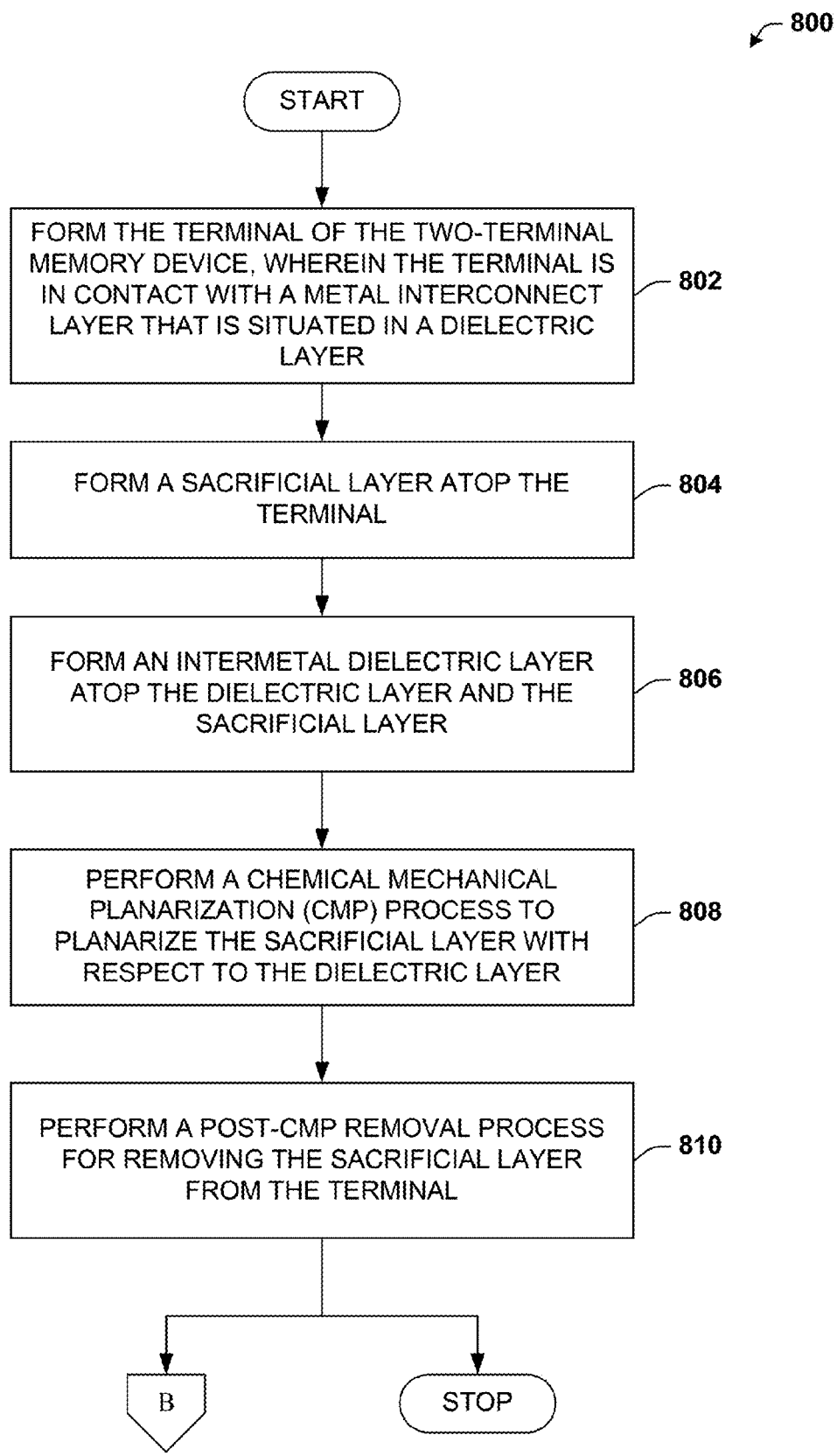
FIG. 8 illustrates an example methodology that can provide for mitigating potential damage to a terminal of a two-terminal memory device during fabrication of the two-terminal memory device in accordance with certain embodiments of this disclosure.

With reference now to FIG. 8, example method 800 is depicted. Method 800 can provide for mitigating damage to a terminal of a two-terminal memory device during fabrication of the two-terminal memory device. For instance, at reference numeral 802, the terminal of the two-terminal memory device can be formed. The terminal can be formed in contact with and/or patterned atop a metal interconnect layer that is situated in a dielectric layer. An example illustration of the terminal having been patterned or otherwise formed is provided with reference to FIG. 3A. At reference numeral 804, a sacrificial layer can be formed atop the terminal. An example illustration of the sacrificial layer (e.g., sacrificial layer 312) being formed on a surface (e.g., top surface 306) of the terminal (e.g., terminal 112) can be found with reference to FIG. 3B.

At reference numeral 806, an intermetal dielectric layer can be formed atop the dielectric layer and the sacrificial layer. Thus, the intermetal dielectric can cover or envelope the sacrificial layer and the terminal. An example illustration of the intermetal dielectric having been deposited or otherwise formed is provided with reference to FIG. 4B.

At reference numeral 808, a chemical mechanical planarization (CMP) process can be performed. The CMP process can operate to planarize the sacrificial layer with respect to the intermetal dielectric layer. For instance, the CMP can include an abrasive slurry chemical in combination with a mechanical polishing that removes an exposed surface of intermetal dielectric layer to reach a top surface of the sacrificial layer, in which case the intermetal dielectric layer and the sacrificial layer are planarized. An example illustration of the sacrificial layer having been planarized with respect to the intermetal dielectric layer is provided with reference to FIG. 5B. As illustrated, as a result of the CMP process the sacrificial layer operates to prevent damage (e.g., that affects the crystalline nature of a silicon-based composition) to the terminal.

At reference numeral 810, a post-CMP removal process can be performed. The post-CMP removal process can operate to remove a remaining portion of the sacrificial layer. An example illustration of the memory device after the sacrificial layer is removed is provided with reference to FIG. 10.

Figure 9:
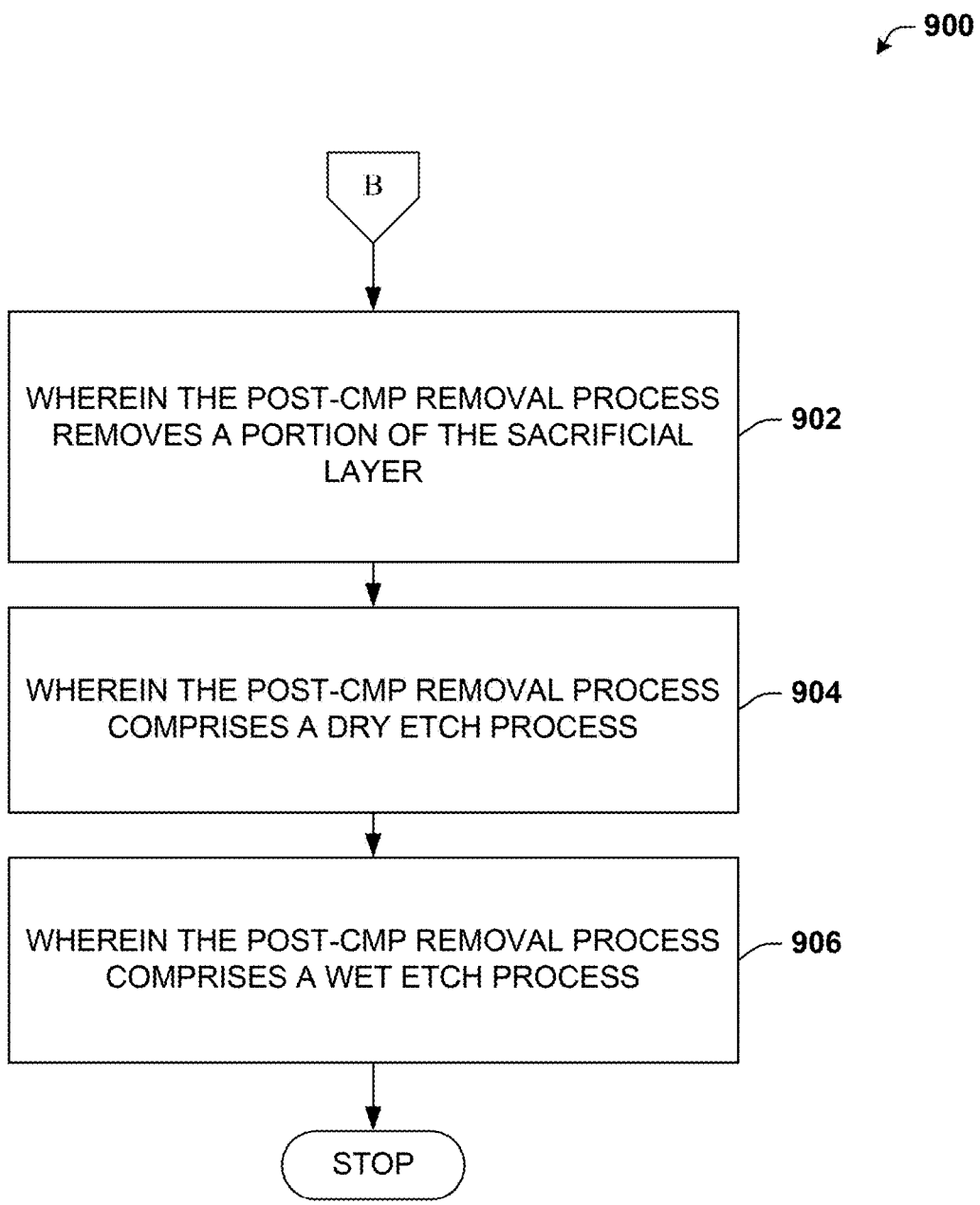
FIG. 9 illustrates an example methodology that can provide for additional features or aspects in connection with mitigating damage to a terminal of a two-terminal memory device during fabrication of the two-terminal memory device in accordance with certain embodiments of this disclosure.

With reference now to FIG. 9, example method 900 is depicted. Method 900 can provide for additional features or aspects in connection with mitigating damage to a terminal of a two-terminal memory device during fabrication of the two-terminal memory device. For instance, at reference numeral 902, it is understood that the CMP process can operate to remove some portion of the sacrificial layer, however, as long as a sufficient amount of the sacrificial layer remains, the terminal can be protected. Thus, it is understood that only a portion of the sacrificial layer that was initially formed might be removed (e.g., the remained was removed by the CMP process).

At reference numeral 904, the post-CMP removal process can comprise a dry etch process. Additionally or alternatively, as indicated at reference numeral 906, the post-CMP removal process can comprise a wet etch process. In the case of a wet etch process or a dry etch process, the associated process can operate to remove the sacrificial layer without significant damage to the terminal.

Example Operating Environments

Figure 12:
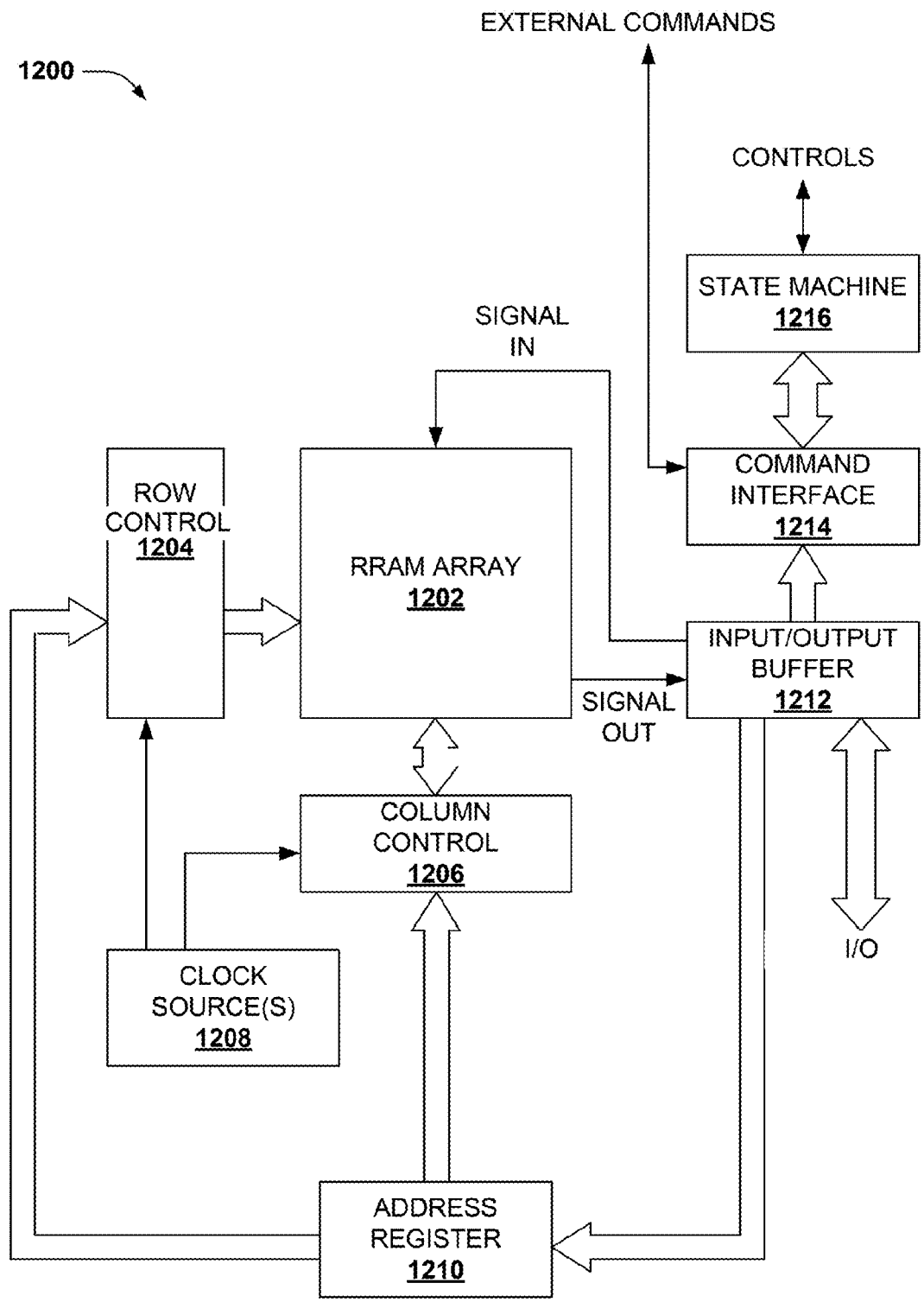
FIG. 12 illustrates a block diagram of an example electronic operating environment in accordance with certain embodiments of this disclosure.

In order to provide a context for the various aspects of the disclosed subject matter, FIG. 12, as well as the following discussion, is intended to provide a brief, general description of a suitable environment in which various aspects of the disclosed subject matter can be implemented or processed. While the subject matter has been described above in the general context of semiconductor architectures and process methodologies for fabricating and operating such architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer, which can include single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone electronic devices, such as a memory card, Flash memory module, removable memory (e.g. CF card, USB memory stick, SD card, microSD card), or the like. In a distributed computing environment, program modules can be located in both local and remote memory storage modules or devices.

FIG. 12 illustrates a block diagram of an example operating and control environment 1200 for a RRAM array 1202 according to aspects of the subject disclosure. In at least one aspect of the subject disclosure, RRAM array 1202 can comprise a variety of RRAM memory cell technology. Particularly, RRAM array can be configured or operated to mitigate or avoid sneak path currents of the RRAM array, as described herein.

A column controller 1206 can be formed adjacent to RRAM array 1202. Moreover, column controller 1206 can be electrically coupled with bit lines of RRAM array 1202. Column controller 1206 can control respective bitlines, applying suitable program, erase or read voltages to selected bitlines.

In addition, operating and control environment 1200 can comprise a row controller 1204. Row controller 1204 can be formed adjacent to column controller 1206, and electrically connected with word lines of RRAM array 1202. Row controller 1204 can select particular rows of memory cells with a suitable selection voltage. Moreover, row controller 1204 can facilitate program, erase or read operations by applying suitable voltages at selected word lines.

A clock source(s) 1208 can provide respective clock pulses to facilitate timing for read, write, and program operations of row control 1204 and column control 1206. Clock source(s) 1208 can further facilitate selection of word lines or bit lines in response to external or internal commands received by operating and control environment 1200. An input/output buffer 1212 can be connected to an external host apparatus, such as a computer or other processing device (not depicted) by way of an I/O buffer or other I/O communication interface. Input/output buffer 1212 can be configured to receive write data, receive an erase instruction, output readout data, and receive address data and command data, as well as address data for respective instructions. Address data can be transferred to row controller 1204 and column controller 1206 by an address register 1210. In addition, input data is transmitted to RRAM array 1202 via signal input lines, and output data is received from RRAM array 1202 via signal output lines. Input data can be received from the host apparatus, and output data can be delivered to the host apparatus via the I/O buffer.

Commands received from the host apparatus can be provided to a command interface 1214. Command interface 1214 can be configured to receive external control signals from the host apparatus, and determine whether data input to the input/output buffer 1212 is write data, a command, or an address. Input commands can be transferred to a state machine 1216.

State machine 1216 can be configured to manage programming and reprogramming of RRAM array 1202. State machine 1216 receives commands from the host apparatus via input/output interface 1212 and command interface 1214, and manages read, write, erase, data input, data output, and like functionality associated with RRAM array 1202. In some aspects, state machine 1216 can send and receive acknowledgments and negative acknowledgments regarding successful receipt or execution of various commands.

To implement read, write, erase, input, output, etc., functionality, state machine 1216 can control clock source(s) 1208. Control of clock source(s) 1208 can cause output pulses configured to facilitate row controller 1204 and column controller 1206 implementing the particular functionality. Output pulses can be transferred to selected bit lines by column controller 1206, for instance, or word lines by row controller 1204, for instance.

In connection with FIG. 13, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 13:
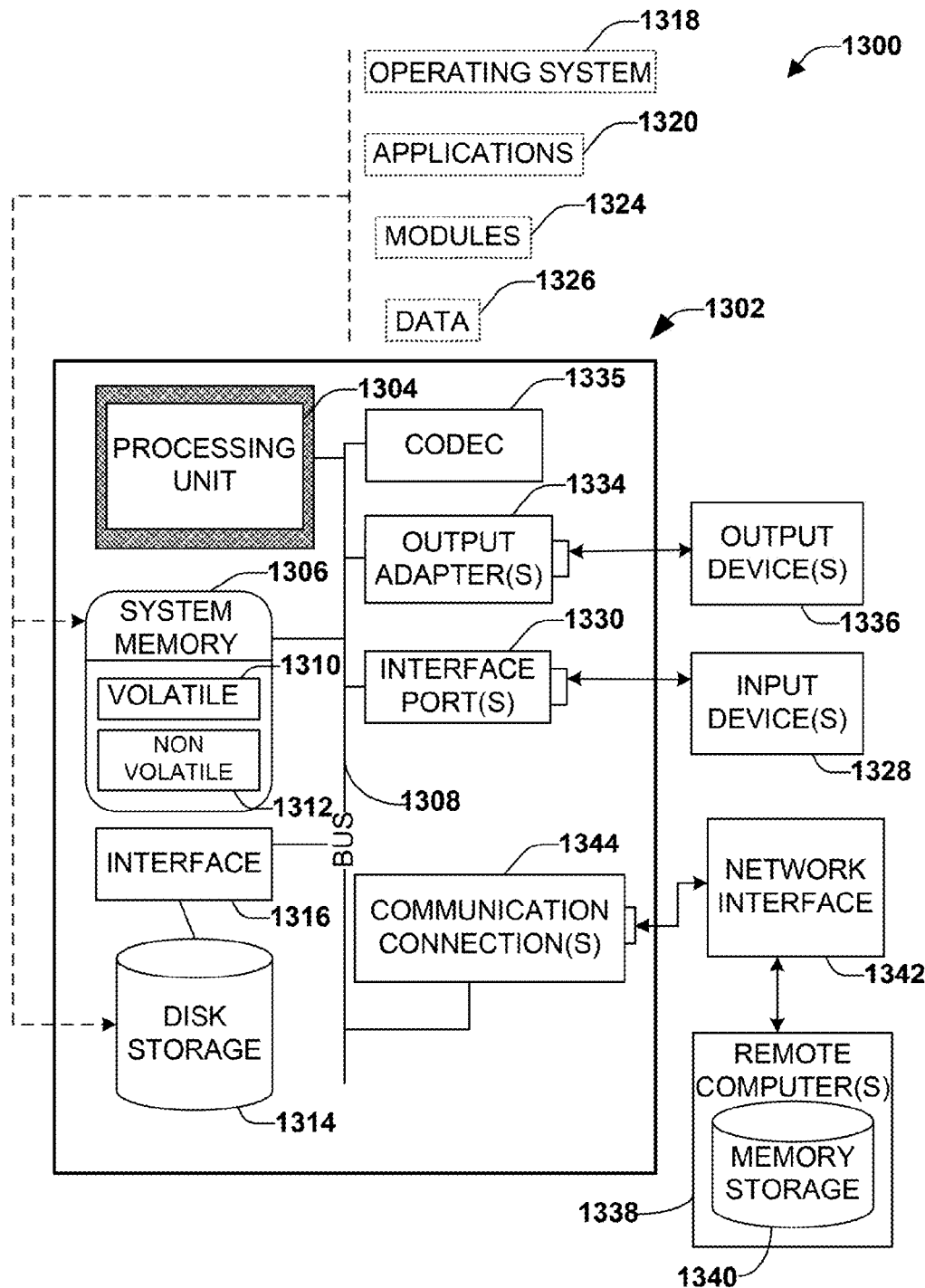
FIG. 13 illustrates a block diagram of an example computing environment that can be implemented in accordance with certain embodiments of this disclosure.

With reference to FIG. 13, a suitable operating environment 1300 for implementing various aspects of the claimed subject matter includes a computer 1302. The computer 1302 includes a processing unit 1304, a system memory 1306, a codec 1335, and a system bus 1308. The system bus 1308 couples system components including, but not limited to, the system memory 1306 to the processing unit 1304. The processing unit 1304 can be any of various available processors. Dual microprocessors and other multiprocessor architectures also can be employed as the processing unit 1304.

The system bus 1308 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1306 includes volatile memory 1310 and non-volatile memory 1312, which can employ one or more of the disclosed memory architectures, in various embodiments. The basic input/output system (BIOS), containing the basic routines to transfer information between elements within the computer 1302, such as during start-up, is stored in non-volatile memory 1312. In addition, according to present innovations, codec 1335 may include at least one of an encoder or decoder, wherein the at least one of an encoder or decoder may consist of hardware, software, or a combination of hardware and software. Although, codec 1335 is depicted as a separate component, codec 1335 may be contained within non-volatile memory 1312. By way of illustration, and not limitation, non-volatile memory 1312 can include read only memory (ROM), programmable ROM (PROM), electrically programmable ROM (EPROM), electrically erasable programmable ROM (EEPROM), or Flash memory. Non-volatile memory 1312 can employ one or more of the disclosed memory architectures, in at least some disclosed embodiments. Moreover, non-volatile memory 1312 can be computer memory (e.g., physically integrated with computer 1302 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1310 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1302 may also include removable/non-removable, volatile/non-volatile computer storage medium. FIG. 13 illustrates, for example, disk storage 1314. Disk storage 1314 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1314 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1314 to the system bus 1308, a removable or non-removable interface is typically used, such as interface 1316. It is appreciated that disk storage 1314 can store information related to a user. Such information might be stored at or provided to a server or to an application running on a user device. In one embodiment, the user can be notified (e.g., by way of output device(s) 1336) of the types of information that are stored to disk storage 1314 and/or transmitted to the server or application. The user can be provided the opportunity to opt-in or opt-out of having such information collected and/or shared with the server or application (e.g., by way of input from input device(s) 1328).

It is to be appreciated that FIG. 13 describes software that acts as an intermediary between users and the basic computer resources described in the suitable operating environment 1300. Such software includes an operating system 1318. Operating system 1318, which can be stored on disk storage 1314, acts to control and allocate resources of the computer 1302. Applications 1320 take advantage of the management of resources by operating system 1318 through program modules 1324, and program data 1326, such as the boot/shutdown transaction table and the like, stored either in system memory 1306 or on disk storage 1314. It is to be appreciated that the claimed subject matter can be implemented with various operating systems or combinations of operating systems.

A user enters commands or information into the computer 1302 through input device(s) 1328. Input devices 1328 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1304 through the system bus 1308 via interface port(s) 1330. Interface port(s) 1330 include, for example, a serial port, a parallel port, a game port, and a universal serial bus (USB). Output device(s) 1336 use some of the same type of ports as input device(s) 1328. Thus, for example, a USB port may be used to provide input to computer 1302 and to output information from computer 1302 to an output device 1336. Output adapter 1334 is provided to illustrate that there are some output devices, such as monitors, speakers, and printers, among other output devices, which require special adapters. The output adapter 1334 can include, by way of illustration and not limitation, video and sound cards that provide a means of connection between the output device 1336 and the system bus 1308. It should be noted that other devices and/or systems of devices provide both input and output capabilities such as remote computer(s) 1338.

Computer 1302 can operate in a networked environment using logical connections to one or more remote computers, such as remote computer(s) 1338. The remote computer(s) 1338 can be a personal computer, a server, a router, a network PC, a workstation, a microprocessor based appliance, a peer device, a smart phone, a tablet, or other network node, and typically includes many of the elements described relative to computer 1302. For purposes of brevity, only a memory storage device 1340 is illustrated with remote computer(s) 1338. Remote computer(s) 1338 is logically connected to computer 1302 through a network interface 1342 and then connected via communication connection(s) 1344. Network interface 1342 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1344 refers to the hardware/software employed to connect the network interface 1342 to the system bus 1308. While communication connection 1344 is shown for illustrative clarity inside computer 1302, it can also be external to computer 1302. The hardware/software necessary for connection to the network interface 1342 includes, for exemplary purposes only, internal and external technologies such as, modems including regular telephone grade modems, cable modems and DSL modems, ISDN adapters, and wired and wireless Ethernet cards, hubs, and routers.

Figure 14:
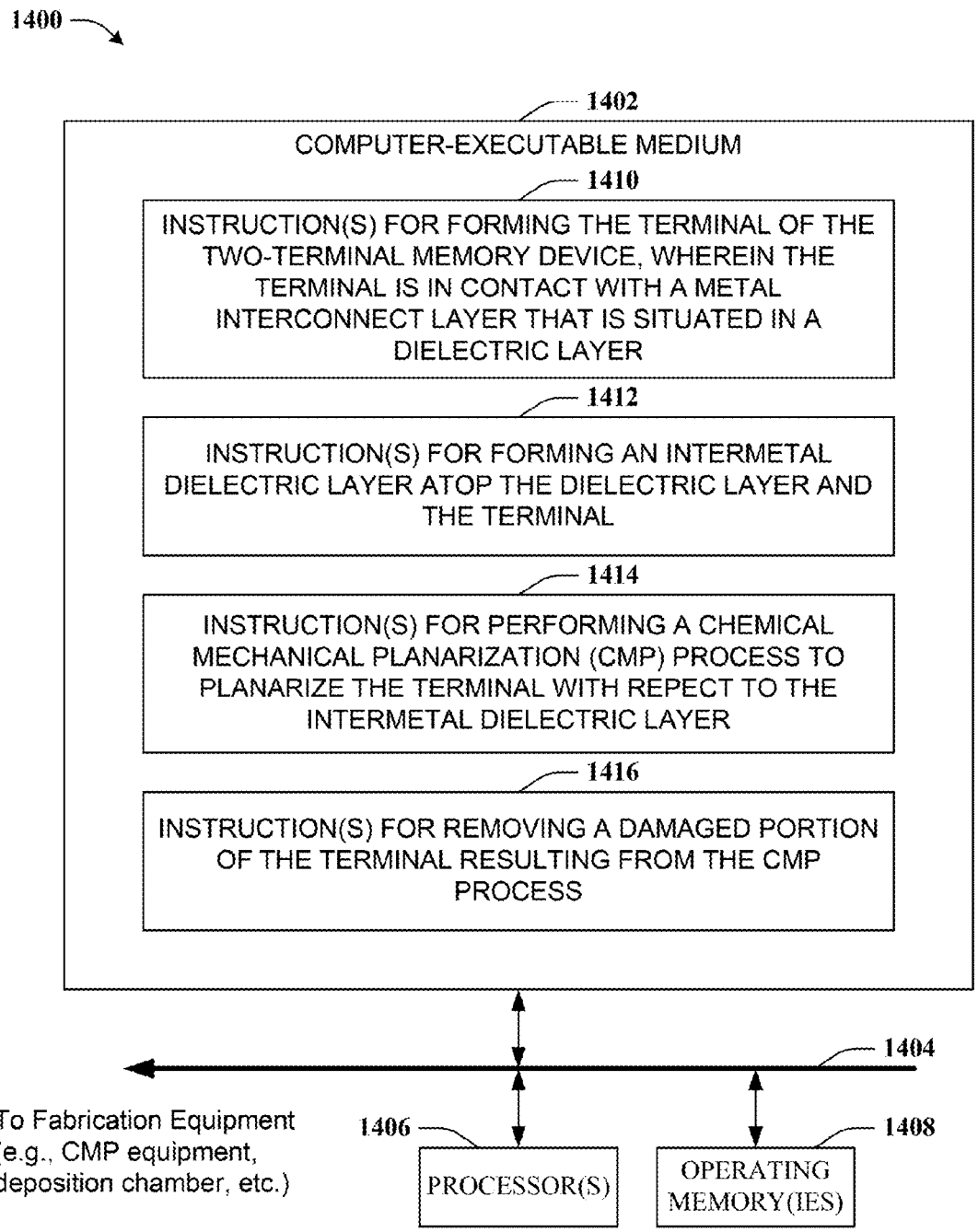
FIG. 14 and FIG. 15 illustrate block diagrams of example operating and control environments in accordance with certain embodiments of this disclosure.

FIG. 14 illustrates a block diagram of an example electronic device 1400 for implementing one or more aspects of the subject disclosure. In various embodiments, electronic device 1400 can be configured for removing damage resulting from a CMP process from a terminal of a two-terminal memory device. While computer-executable medium 1402 is depicted as remote from fabrication equipment and other described elements, in some embodiments, electronic device 1400 can reside at least partially within fabrication equipment, a memory (e.g., operating memory 1408), a memory module, a handheld computer, a personal computer, a networked computer, or the like. It is to be appreciated that apparatus 1400 is represented as including functional blocks, which can be functional blocks that represent functions implemented by hardware, software, or combination thereof (e.g., firmware). In some aspects, these functional blocks can represent non-transitory computer-readable media. In other aspects, the functional blocks can represent transitory computer-readable media.

Electronic device 1400 can comprise an electronically executable medium 1402 comprising stored instructions that, once executed, facilitate operations associated with the fabricating of a two terminal memory device or cell. Electronically executable medium 1402 can be operated, executed, or accessed over a data communication interface 1404. Data communication interface 1404 can include a data bus, a dataline, a bitline, a wired or wireless communication interface, a network or network interface, or the like, or a suitable combination thereof. In at least one aspect of the subject disclosure, a subset of the stored operations for facilitating fabrication of the two-terminal memory cell can include computer-executable instructions stored in an operating memory(ies) 1408 and/or executed by a processor(s) 1406 to facilitate functionality of electronic device 1400. In another aspect, one or more of the stored instructions can be replaced by one or more electrical, mechanical, or electromechanical means for executing the operations, in response to activation by a processor means or a mechanical automation means.

As depicted, electronically executable component 1402 can comprise instructions 1410 for forming a terminal of a two-terminal memory device. The terminal can be in contact with a metal interconnect layer that is situated in a dielectric layer. Further, electronically executable medium 1402 can comprise instructions 1412 for forming an intermetal dielectric layer atop the dielectric layer and the terminal. Additionally, electronically executable medium 1402 can comprise instructions 1414 for performing a CMP process to planarize the terminal with respect to the intermetal dielectric layer. Electronically executable medium 1402 can also comprise instructions 1416 for removing a damaged portion of the terminal resulting from the CMP process.

Figure 15:
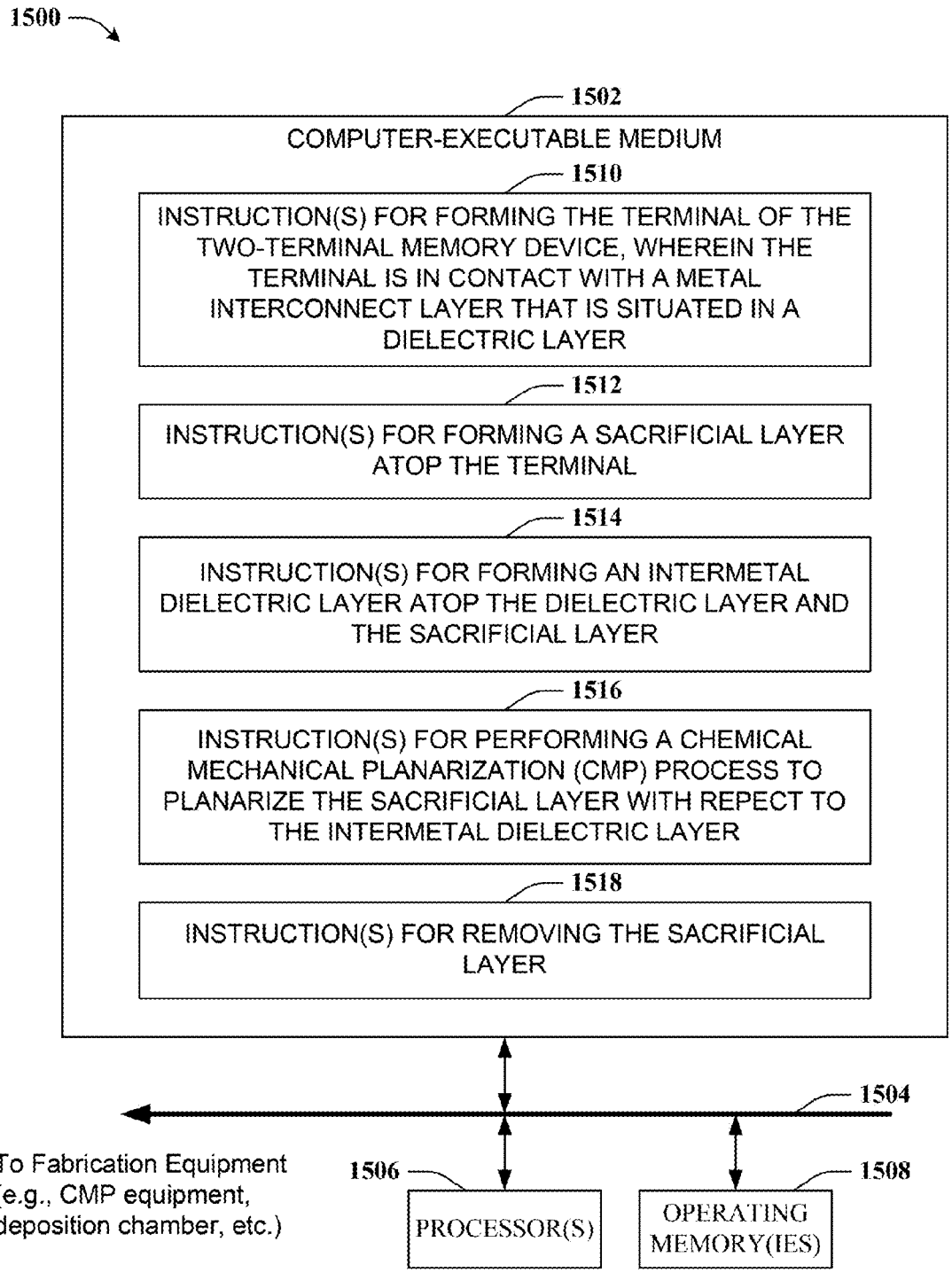

FIG. 15 illustrates a block diagram of an example electronic device 1500 for implementing one or more aspects of the subject disclosure. In various embodiments, electronic device 1500 can be configured for removing the remainder of a sacrificial layer that protects a terminal of a two-terminal memory device from damage resulting from a CMP process. As depicted, electronically executable component 1502 can comprise instructions 1510 for forming a terminal of a two-terminal memory device. The terminal can be in contact with a metal interconnect layer that is situated in a dielectric layer. Electronically executable medium 1502 can comprise instructions 1512 for forming a sacrificial layer atop the terminal. Electronically executable medium 1502 can comprise instructions 1514 for forming an intermetal dielectric layer atop the dielectric layer and the sacrificial layer. Electronically executable medium 1502 can comprise instructions 1516 for performing a CMP process to planarize the sacrificial layer with respect to the intermetal dielectric layer. Electronically executable medium 1502 can also comprise instructions 1518 for removing any remaining portions of the sacrificial layer.

In various embodiments of the subject disclosure, disclosed memory architectures can be employed as a stand-alone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact flash (CF) card, or the like, or suitable combinations of the foregoing. (See, e.g., FIGS. 12 and 13, supra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, several structural, performance, and reliability problems became evident. A subset of these or similar considerations are addressed by the disclosed aspects.

It is understood the illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject innovation(s). Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method for removing damage from a terminal of a two-terminal memory device during fabrication of the two-terminal memory device, comprising:
   forming the terminal of the two-terminal memory device comprising a monolithic stack of layers including the terminal, wherein the terminal is in contact with a metal interconnect layer that is situated in a dielectric layer;

forming an intermetal dielectric layer atop the dielectric layer and the terminal;

performing a chemical mechanical planarization (CMP) process to planarize the terminal with respect to the intermetal dielectric layer; and performing a first post-CMP process for removing a damaged portion of the terminal resulting from the CMP process.

2. The method of claim 1, wherein the two-terminal memory device is a resistive switching memory device.

3. The method of claim 1, wherein the terminal comprises at least one of: p-type silicon (Si), doped p-type silicon germanium (SiGe) with a germanium (Ge) proportion of the terminal in a range of between about ten percent to about sixty percent, or a metal comprising at least one of tungsten (W), copper (Cu), aluminum (Al), titanium nitride (TiN), tantalum nitride (TaN), nickel (Ni), or molybdenum (Mo).

4. The method of claim 1, wherein a height of the terminal is in a range of about 50 nanometers (nm) to about 300 nm.

5. The method of claim 1, wherein a width of the terminal is in a range of about 10 nm to about 200 nm.

6. The method of claim 1, wherein a top surface of the terminal has a surface height variation of less than about 10 nm after forming the terminal or after performing the first post-CMP process.

7. The method of claim 1, wherein the intermetal dielectric layer comprises at least one of: silicon dioxide ($SiO_2$), fluorine doped silicate glass (FSG), a low-K dielectric, or a nitride.

8. The method of claim 1, wherein the first post-CMP process is a light etching process that employs at least one of: plasma oxygen ($O_2$) ash, sulfuric acid ($H_2SO_4$), hydrogen peroxide ($H_2O_2$), water ($H_2O$), ozone ($O_3$), hydrogen fluoride (HF), or ammonium hydroxide ($NH_4OH$).

9. The method of claim 1, further comprising a second post-CMP process for cleaning an exposed surface of the terminal.

10. The method of claim 9, wherein the second post-CMP process removes from the exposed surface of the terminal oxides resulting from the CMP process or the first post-CMP process.

11. The method of claim 9, wherein the second post-CMP process employs HF in connection with the cleaning.

12. The method of claim 1, further comprising forming a set of dummy elements on a wafer that includes an array of terminals comprising the terminal prior to the performing the CMP process, wherein the array includes the terminal, and the set of dummy elements are formed outside the array.

13. The method of claim 1, further comprising:

forming, in the monolithic stack of layers, an interface layer comprising non-stoichiometric silicon compound comprising crystalline defects in contact with the terminal;

forming, in the monolithic stack of layers, an active metal layer in contact with the interface layer configured to provide filament forming particles comprising silver or aluminum to the crystalline defects within the interface layer comprising;

forming a second terminal of the two-terminal memory device; or coupling the second terminal to the active metal layer.

14. A method for mitigating damage to a terminal of a two-terminal memory device during fabrication of the two-terminal memory device, comprising:

forming the terminal of the two-terminal memory device, wherein the terminal is in contact with and patterned on a metal interconnect layer of the two-terminal memory device and the metal interconnect layer is situated in a dielectric layer;

forming a sacrificial layer atop the terminal;

forming an intermetal dielectric layer atop the dielectric layer and the sacrificial layer;

performing a chemical mechanical planarization (CMP) process to planarize the sacrificial layer with respect to the intermetal dielectric layer; and performing a post-CMP removal process for removing the sacrificial layer from the terminal.

15. The method of claim 14, wherein the terminal comprises at least one of: p-type silicon (Si), doped p-type silicon germanium (SiGe) with a germanium (Ge) proportion of the terminal in a range of between about ten percent to about sixty percent, or a metal comprising at least one of tungsten (W), copper (Cu), aluminum (Al), titanium nitride (TiN), tantalum nitride (TaN), nickel (Ni), or molybdenum (Mo).

16. The method of claim 14, wherein a height of the terminal is in a range of about 50 nanometers (nm) to about 300 nm.

17. The method of claim 14, wherein a width of the terminal is in a range of about 10 nm to about 200 nm.

18. The method of claim 14, wherein a top surface of the terminal has a surface height variation of less than about 10 nm after forming the terminal or after performing the post-CMP removal process.

19. The method of claim 14, wherein the sacrifical layer comprises at least one of: tungsten (W), titanium nitride (TiN), or a nitride.

20. The method of claim 14, wherein the intermetal dielectric layer comprises at least one of: silicon dioxide ($SiO_2$), fluorine doped silicate glass (FSG), a low-K dielectric, or a nitride.

21. The method of claim 14, wherein the post-CMP process removes a portion of the sacrificial layer.

22. The method of claim 14, wherein the post-CMP removal process comprises a dry etch process.

23. The method of claim 14, wherein the post-CMP removal process comprises a wet etch process.

24. The method of claim 14, further comprising:

forming an interface layer comprising a non-stoichiometric silicon compound in contact with the terminal;

forming an active metal layer in contact with the interface layer configured to provide filament forming particles to crystalline defects within the interface layer, wherein the filament forming particles comprise silver or aluminum;

forming another terminal of the two-terminal memory device; or coupling the other terminal to the active metal layer.

* * * * *